United States Patent [19]
Persons

[11] Patent Number: 5,521,493
[45] Date of Patent: May 28, 1996

[54] SEMICONDUCTOR TEST SYSTEM INCLUDING A NOVEL DRIVER/LOAD CIRCUIT

[75] Inventor: Thomas W. Persons, Los Altos, Calif.

[73] Assignee: Megatest Corporation, San Jose, Calif.

[21] Appl. No.: 342,697

[22] Filed: Nov. 21, 1994

[51] Int. Cl.⁶ .................................................. G01R 31/22
[52] U.S. Cl. .................................... 324/158.1; 324/73.1
[58] Field of Search ............................ 324/73.1, 158.1, 324/765, 760; 371/15.1, 22.3, 22.6, 25.1

[56] References Cited

U.S. PATENT DOCUMENTS

| | | | |
|---|---|---|---|
| 3,549,995 | 12/1970 | Trousdale et al. | 324/73.1 |
| 4,583,223 | 4/1986 | Inoue et al. | 324/73.1 |
| 4,929,888 | 5/1990 | Yoshida | 324/158.1 |
| 5,200,696 | 4/1993 | Menis et al | 324/158.1 |

Primary Examiner—Vinh P. Nguyen
Attorney, Agent, or Firm—Steven F. Caserza; Flehr, Hohbach, Test, Albritton & Herbert

[57] ABSTRACT

A novel pin electronics design and method is taught which serves to minimize the capacitive loading of the driver and load portion of the pin electronics. The driver and load circuitry are combined to form a novel driver/load circuit, thereby reducing capacitive loading, simplifying circuit structure, and improving the speed of operation of the test system and the accuracy of the test.

6 Claims, 3 Drawing Sheets

SEMICONDUCTOR TEST SYSTEM INCLUDING A NOVEL DRIVER/LOAD CIRCUIT

INTRODUCTION

1. Field of Invention

This invention pertains to electronic test systems, and more particularly to a test system suitable for testing electronic circuits, including integrated circuits.

2. Description of Prior Art

Computers have been used for quite some time to automatically test various electronic circuits and components. As electronic circuits and components become more complex and operate at higher speeds, testing complexity has increased. A significant amount of effort has been and continues to be expended in providing advanced test equipment capable of rapidly testing complex functions of circuits at a high rate of speed in order to ensure proper operation of the devices under test.

An example of a typical prior art test system is shown in FIG. 1. Test system 100 is suitable for use in testing various types of electronic circuits and components, and is widely used in testing semiconductor integrated circuits such as device under test (DUT) 101. Test system 100 includes a digital computer portion 105 which includes a test controller and a pattern controller which are digitally programmed to control the operation of test system 100. The test controller is a computer which allows the user to interface to test system 100 by means of a control program. The pattern controller controls the pattern flow of signals which are sent to DUT 101.

In operation, test system 100 follows the instructions provided to run digital computer portion 105 in order to apply appropriate voltages and currents to, and sense appropriate currents and voltages from, various pins of DUT 101. Test system 100 includes analog portion 106 which includes timing generators, DUT power supplies, and DC measurement system components which operate under control of digital computer portion 105 in order to provide, at the appropriate times, the desired voltages and currents to selected pins of DUT 101 and, at appropriate times, sense the resulting currents and voltages from pins of DUT 101. As part of this process, the sensed currents and voltages are compared to proper values in order to determine the operating characteristics of DUT 101.

Test head pin electronics 107 serve to interface analog portion 106 of test system 100 to DUT 101. Test head 107 is where signals are either generated and sent to DUT 101 or detected from DUT 101. Timing generators within analog portion 106 of test system 100 generate the timing control signals for the pin electronics of test head 107. The DUT power supplies of analog portion 106 provide appropriate power to DUT 101. The DC measurement system of analog portion 106 forces voltages and currents to DUT 101 and measures resulting currents and voltage, as well as calibrates the DC functions of test system 100.

Referring to FIG. 2, pin electronics 200 of a typical prior art test system includes driver 201, load 202, and comparator 203. Each of these components are coupled in common to a pin of DUT 101 through transmission line 204. Driver 201 serves to send a digital signal level to a pin of DUT 101 in response to a control signal indicating that a logical one level (VIH) or a logical zero level (VIL) is to be applied to that pin of DUT 101. Load 202 serves to simulate a desired electrical loading condition of the pin of DUT 101 associated with this portion of the pin electronics. Thus, the specific pin of DUT 101 which is being tested by pin electronics 200 shown in FIG. 2 is provided with a specified load by load circuitry 202 in order to determine whether that pin of DUT 101 is capable of operating properly with the load which is seen by that pin during normal operation. Comparator 203 serves to monitor the digital voltage level of the pin of DUT 101 to determine whether that voltage level is equal to a minimum acceptable logical one output signal (VOH) level or is less than a maximum allowed logical zero output signal (VOL) level.

When the pin of DUT 101 associated with pin electronics 200 is to be driven by an input signal generated by the test system, driver 201 is enabled and load 202 is disabled. When load 202 is disabled, IOL and IOH current sources 202a and 202b, respectively, are disabled, effectively tristating output node 202-1 of load 202, thereby providing a high impedance to transmission line 204. Driver 201 sends to transmission line 204 either a logical one input signal (VIH) or logical zero input signal (VIL), as defined by control signal POLARITY. The selection of the appropriate voltage level to be provided by driver 201 is controlled by the test program, which also defines the specific times at which driver 201 will switch its output level between the logical zero and logical one levels, as shown in the timing diagram of FIG. 3.

Conversely, when pin electronics 200 is to measure the output signal provided by a pin of DUT 101, driver 201 is disabled and load 202 is enabled. By enabling load 202, IOL and IOH current sources 202a and 202b, respectively, are turned on sending current through the diode bridge of load 202 allowing the voltage level VCOMM to affect the output voltage on output node 202-1.

The output voltage of the pin of DUT 101 being loaded by pin electronics 200 is applied to comparator 203, which determines if the output voltage of DUT 101 is greater than a minimum acceptable logical one output signal level (VOH) or less than a maximum acceptable logical zero output signal level (VOL). The use of a diode bridge as a load is disclosed in "Understanding The Polaris Diode Bridge Load", by C. McConn, T. Persons, and J. Rehn, available from Megatest Corporation of San Jose, Calif., the assignee of this invention.

A disadvantage exists in the typical prior art structure of FIG. 2 in that each of the three separate functional blocks, driver 201, load 202, and comparator 203, contribute to the lumped capacitive loading of the pin of DUT 101. The higher this lumped capacitance, the lower the effective response time of comparator 203, which reduces the availability of the test system to accurately test signals from DUT 101. A high lumped capacitance also increases the overall capacitive loading seen by DUT 101, thereby adversely affecting its performance and thus the reliability of the electrical test being performed.

SUMMARY OF THE INVENTION

In accordance with the teachings of this invention, a novel pin electronics design and method is taught which serves to minimize the capacitive loading of the driver and load portion of the pin electronics. In accordance with the teachings of this invention, the driver and load circuitry are combined to form a novel driver/load circuit, thereby reducing capacitive loading, simplifying circuit structure, and improving the speed of operation of the test system and the accuracy of the test.

BRIEF DESCRIPTIONS OF THE DRAWINGS

DETAILED DESCRIPTION OF THE INVENTION

Figure 4:
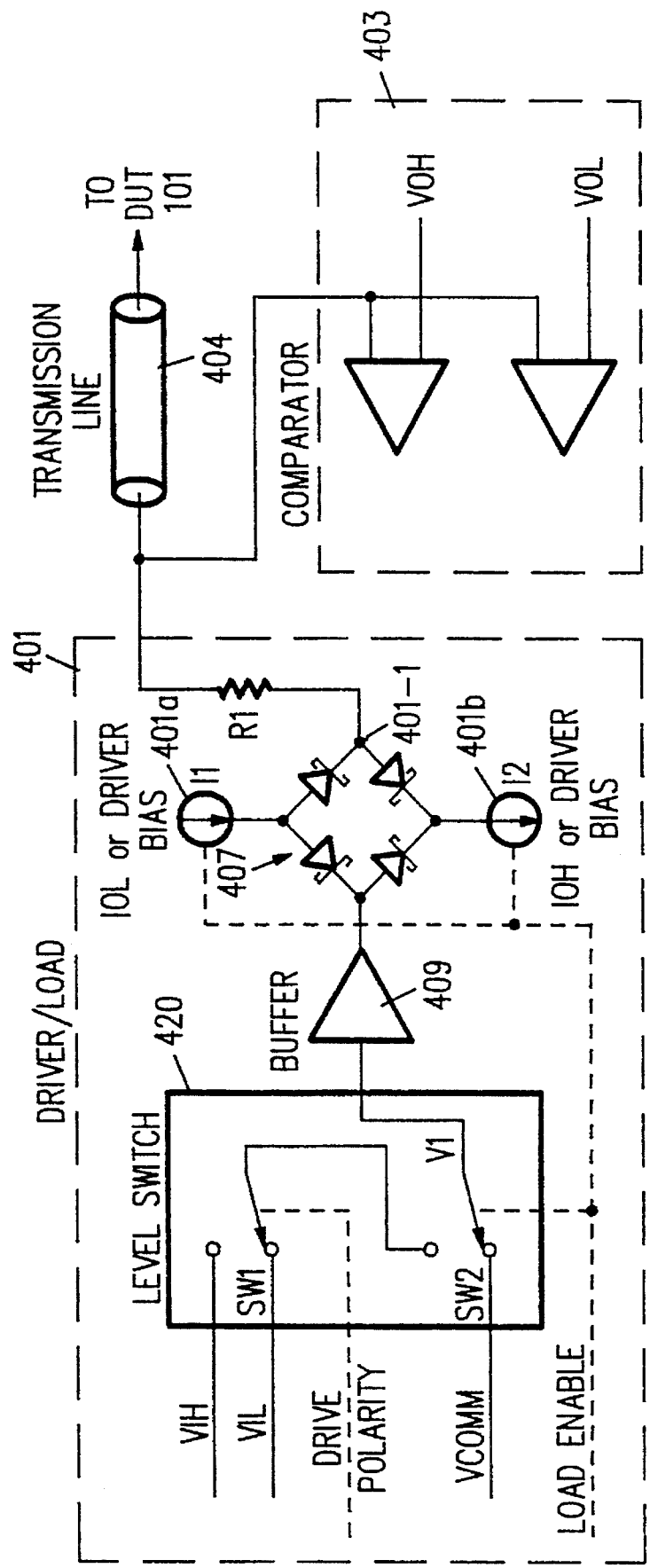
FIG. 4 is a diagram depicting one embodiment of a novel pin electronics architecture constructed in accordance with the teachings of this invention.

FIG. 4 is a diagram depicting the novel pin electronics architecture of one embodiment of this invention. As shown in FIG. 4, pin electronics 400 includes transmission line 404 for coupling pin electronics 400 to a pin of DUT 101. Pin electronics 400 also includes comparator 403 which operates in a similar fashion as comparator 203 of the prior art pin electronics of FIG. 2.

Figure 2:
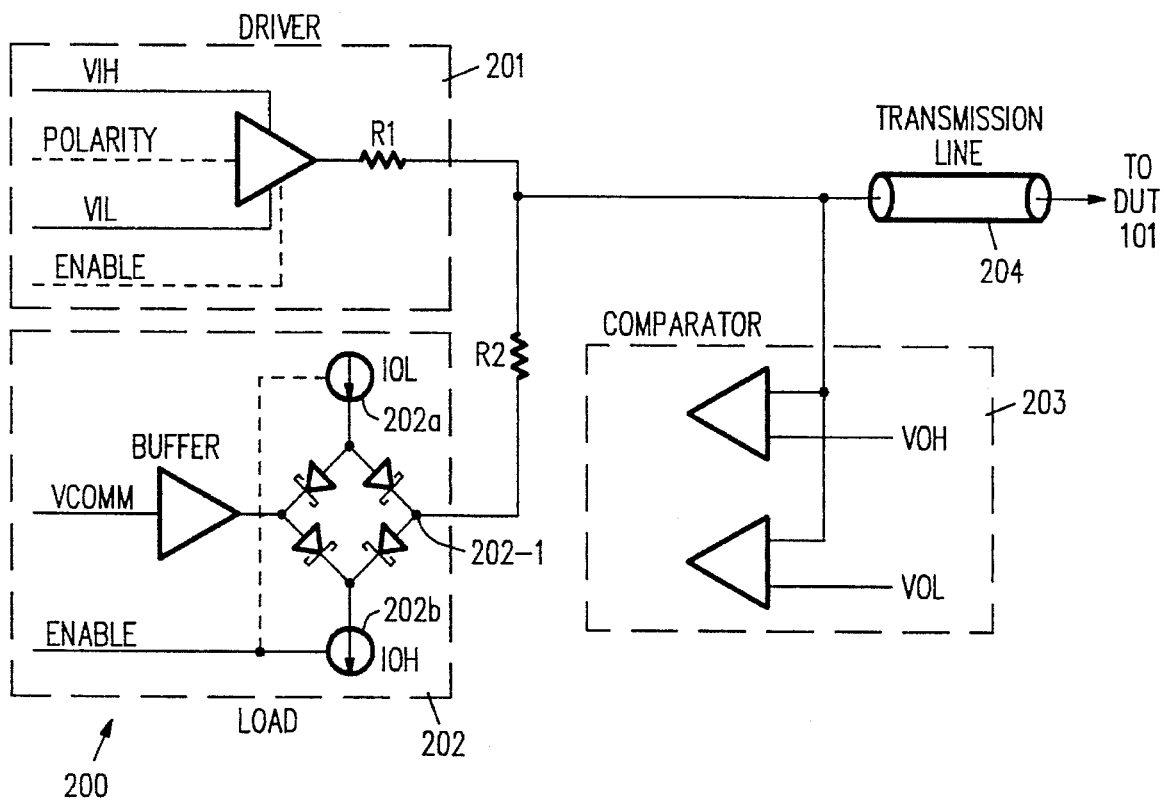
FIG. 2 is a diagram depicting a typical pin electronics architecture of the prior art.

Pin electronics 400 also includes a novel driver/load circuit 401, in which the functions of driver 201 and load 202 of FIG. 2 are combined in order to reduce the capacitive loading of driver/load 401 as compared with the capacitive loadings provided by driver 201 and load 202 of the prior art. This decrease in loading capacitance provided in accordance with the teachings of this invention improves the effective response time of comparator 403 when measuring digital signal output levels of DUT 101.

Driver/load circuit 401 includes current sources 401a and 401b and diode bridge 407 to provide a desired load level on output node 401-1 in response to the VCOMM level applied to diode bridge 407 through buffer 409. Current sources 401a and 401b and diode bridge 407 also serve, in accordance with the teachings of this invention, to provide on output node 401-1 an appropriate logical zero input signal (VIL) or logical one input signal (VIH) level in response to the VIL and VIH signals, respectively, applied to buffer 409 by level switch 420.

Figure 1:
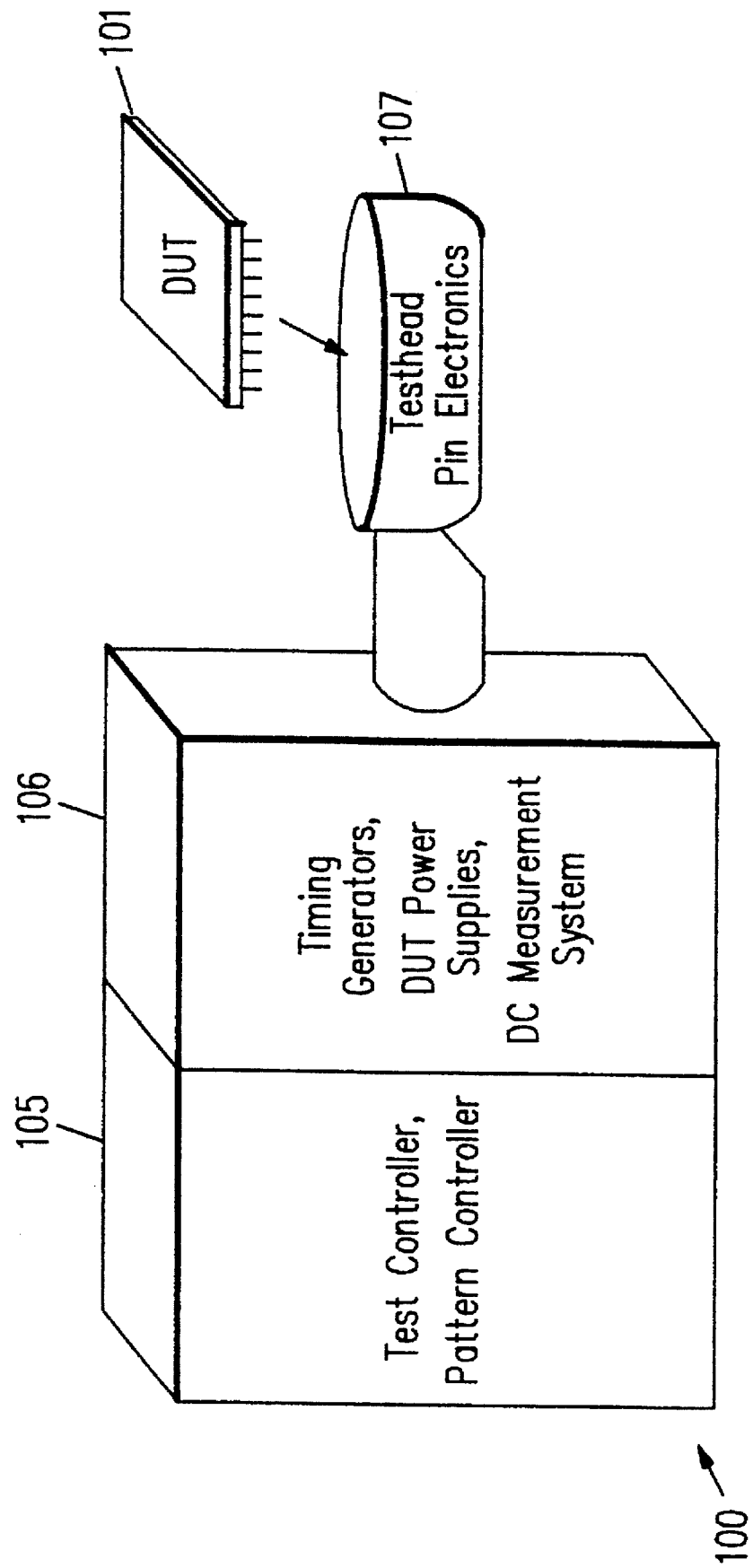
FIG. 1 is a diagram depicting a typical prior art electronic test system.

When driver/load 401 is functioning as a driver in order to provide an appropriate digital input signal having a logical zero or logical one value to DUT 101, the load enable signal is disabled, causing current sources 401a and 401b to switch I1 and I2 to driver bias current levels. With the load enable signal disabled, switch SW2 of level switch 420 is switched to couple the input lead of buffer 409 to the appropriate one of VIL or VIH levels selected by switch SW1 of level switch 420 in response to a Drive Polarity control signal. This drive polarity control signal is provided by the timing generators in response to the test program being run by test system 100 (FIG. 1). The appropriate one of the VIL and VIH input signals is buffered by high speed buffer 409 to provide an output signal which drives the left side of diode bridge 407. The currents I1 and I2 provided to diode bridge 407 by current sources 401a and 401b, respectively, are set to driver bias current levels which are predetermined to cause diode bridge 407 to simply act as a switch passing the output voltage of buffer 409 to output node 401-1 and then to DUT 101 via transmission line 404. Currents I1 and I2 are fixed at levels suitable for providing a desired maximum voltage drive into the impedance of resistor R1 and transmission line 404, for example on the order of 55 to 65 mA or so, in one embodiment, to provide a drive signal of a maximum of about 5 volts into the 100 ohm impedance provided by resistor R1 (50 ohms) and transmission line 404 (50 ohms).

Conversely, when pin electronics 400 is to serve to monitor output signals from DUT 101, driver/load 401 is configured to serve as a load. This is accomplished by enabling the LOAD ENABLE signal, thereby setting the currents I1 and I2 provided by current sources 401a and 401b to their IOL and IOH levels, respectively. The active LOAD ENABLE signal also serves to control switch SW2 of level switch 420 to apply the VCOMM voltage level to the input lead of buffer 409, which provides a buffered output voltage to the left side of diode bridge 407. The level of this VCOMM signal controls the bias of diode bridge 407 in order to provide an appropriate load on output node 401-1 which is applied to DUT 101 through transmission line 404.

The following are examples of various ways in which driver/load 401 can operate as a load having desired characteristics for specific testing purposes.

One way driver/load 401 can be used is as a transmission line termination for signals coming from the DUT. A termination is a resistor connected at the end of the transmission line which matches the characteristic impedance of the transmission line. In an embodiment of this invention in which the characteristic impedance is 50 ohms, in order to make driver/load 401 appear like a 50 ohm resistor, IOL and IOH are programmed to 50 mA. This makes diode bridge 407 act as a switch that is turned on connecting the output lead of buffer 409 to node 401-1, with a series of diode bridge 407 having resistance of about 10 ohms. This resistance together with resistor R1 of approximately 40 ohms will total 50 ohms. The user can program VCOMM to a level appropriate to his application. For example, if the user wants to use driver/load 401 to test a DUT ECL (Emitter Coupled Logic) output signal. Typically ECL is terminated with 50 ohms connected to −2 V, so the user will program IOL and IOH to 50 mA and VCOMM to −2 V.

An alternative way to use driver/load 401 is as a current source to measure the output voltage of the DUT when the DUT is sinking or sourcing current. Usually this measurement is done when the DUT is in a static (DC) state. To achieve this mode of operation, the user will set VCOMM so that all of IOL or IOH is diverted through one of the diodes of diode bridge 407 to the DUT. For example, if the user wants to test a DUT output at a logic low level (in this case 0 V) while it is sinking 16 mA, the user programs IOL to 16 mA and VCOMM to +7 V to bias diode bridge 407 such that all of the IOL current will be drawn from node 401-1. Thus, when the DUT output signal is low it will be sinking 16 mA and the output voltage at this current load can be measured.

Another alternative way driver/load 401 is used is as a commutating load. A commutating load uses a diode bridge as a switch to route (commutate) current either to the DUT or the load's buffer as the DUT output voltage varies from a logic high to a logic low. This allows different load currents to be applied to the DUT depending on the DUT output voltage level. For example, if the user wants the DUT to be forcing 5 mA when it is at a logic high of 5 V and sink 10 mA when at a logic low of 0 V, the user sets IOL to 10 mA, IOH to 5 mA, and VCOMM to 2.5 V. When the DUT output voltage is less than VCOMM, IOL current is routed through the diodes of diode bridge 407 to the DUT and IOH current is routed to buffer 409. Conversely, when the DUT output voltage is greater than VCOMM, IOH current is routed to the DUT and IOL current to buffer 409.

Figure 3:
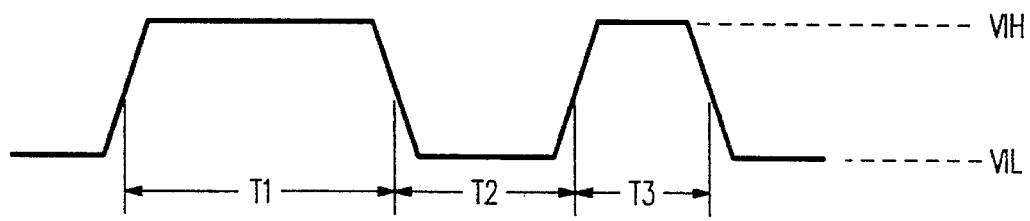
FIG. 3 is a timing diagram depicting the programmable driver levels available from driver 201 of FIG. 2.

There are a number of distinct advantages of the novel driver/load device of this invention. For example, there will be significantly lower capacitance on the output terminal of the present invention which is provided to the device under test, as compared with the prior art, such as the prior art of FIG. 2. In comparing a typical prior art structure of FIG. 2 with that of the embodiment of this invention shown in FIG. 3, the following capacitances have been determined.

|  | Prior Art (FIG. 2) | Present Invention (FIG. 3) |
| --- | --- | --- |
| Driver | 4.5 pf | N/A |
| Load | 2.0 pf | N/A |
| Comparator | 0.5 pf | 0.5 pf |
| Driver/Load | N/A | 2.0 pf |
| Total | 7.0 pf | 2.5 pf |

As shown in the above table, a capacitance reduction of 65% is achieved in accordance with the teachings of this invention.

Furthermore, the teachings of this invention provide higher bandwidth of the pin electronics interfacing to the device under test. This is due to the lower capacitance, as stated above. The bandwidth of the pin electronics receiver in the prior art has been dominated by the pin electronics capacitance rather than the bandwidth of the receiver itself. Using the above example, the maximum possible bandwidth of prior art pin electronic can be calculated as:

$$\text{Bandwidth} = 1/(2 \times \text{pi} \times r \times c)$$
$$\text{Bandwidth (prior art)} = 1/(2 \times 3.14 \times 50 \times 7 \text{ pf}) = 454 \text{ MHz}$$
$$\text{Bandwidth (present invention)} = 1/(2 \times 3.14 \times 50 \times 2.5 \text{ pf}) = 1270 \text{ MHz}$$

In addition to the above embodiments, combining the driver and load functions and eliminating the tristate function of the driver buffer as taught in the present invention has significantly reduced the complexity of the design. Reduced complexity lowers the cost of the design over the prior art since it requires fewer components.

Furthermore, in accordance with the teachings of this invention, power dissipation of the driver/load circuitry is reduced as compared to the prior art, because common functions of the driver and load are shared. The power required in accordance with the teachings of this invention to perform the driver and load functions is approximately 30% less than in the prior art, such as the prior art of FIG. 2. Lower power dissipation is an important issue for large pin count test systems, as lower power dissipation reduces the cost of power supplies, lowers the cost of cooling, and reduces the weight of the testhead since smaller gauge wires and buss bars can be used. Lowering power dissipation also lowers the operating temperature of the electronic circuits used in this design, which improves reliability.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed:

1. A driver/load circuit comprising:

a current source;

a current sink;

a diode bridge having a first node coupled to said current source, a second node coupled to said current sink, a third node serving as an input node, and a fourth node serving as an output node;

a switching circuit for providing to said input node a plurality of signals selected from the group including: a signal associated with a logical high drive signal, a signal associated with a logical low drive signal, and a signal associated with a desired load to be provided by said diode bridge.

2. A driver/load circuit as in claim 1 wherein said current source and said current sink are programmable to provide a first and second fixed driver bias current level, respectively, when said driver/load circuit is operating as a driver, and a desired IOL and IOH current level, respectively, when said driver/load circuit is operating as a load.

3. A driver/load circuit as in claim 1 wherein said switching circuit is configured to receive said plurality of signals and to receive a control signal, and wherein said switching circuit is responsive to said control signal to couple one of said plurality of signals to said input node.

4. A test system for performing electrical tests on a device under test (DUT) comprising:

a computer for generating test patterns;

timing generators responsive to said test patterns;

DUT power supplies for providing programmable voltage levels to a DUT;

a DC measurement system for measuring DC current and voltages from said DUT; and pin electronics for interfacing between said DUT and said timing generators, DUT power supplies, and DC measurement system, wherein said DC measurement system comprises:
a driver/load circuit comprising:
a current source;
a current sink;
a diode bridge having a first node coupled to said current source, a second node coupled to said current sink, a third node serving as an input node, and a fourth node serving as an output node; and
a switching circuit for providing to said input node a plurality of signals selected from the group including: a signal associated with a logical high drive signal, a signal associated with a logical low drive signal, and a signal associated with a desired load to be provided by said diode bridge.

5. A test system as in claim 4 wherein said current source and said current sink are programmable to provide a first and second fixed driver bias current-level, respectively, when said driver/load circuit is operating as a driver, and a desired IOL and IOH current level, respectively, when said driver/load circuit is operating as a load.

6. A test system as in claim 4 wherein said DC measurement system further comprises comparators for detecting voltage levels of said DUT in response to said driver/load circuit serving as a load.

* * * * *